United States Patent
Kaneda

(10) Patent No.: US 9,184,244 B2
(45) Date of Patent: Nov. 10, 2015

(54) HIGH VOLTAGE GALLIUM NITRIDE BASED SEMICONDUCTOR DEVICE AND MANUFACTURING METHOD OF THE SAME

(71) Applicant: Hitachi Metals, Ltd., Tokyo (JP)

(72) Inventor: Naoki Kaneda, Tsuchiura (JP)

(73) Assignee: Sciocs Company Limited, Ibaraki-ken (JP)

( * ) Notice: Subject to any disclaimer, the term of this patent is extended or adjusted under 35 U.S.C. 154(b) by 0 days.

(21) Appl. No.: 14/481,123

(22) Filed: Sep. 9, 2014

(65) Prior Publication Data

US 2015/0243736 A1    Aug. 27, 2015

(30) Foreign Application Priority Data

Feb. 6, 2014    (JP) ................. 2014-021246

(51) Int. Cl.
  *H01L 29/207*  (2006.01)
  *H01L 29/20*  (2006.01)
  *H01L 29/10*  (2006.01)
  *H01L 21/02*  (2006.01)
  *H01L 29/66*  (2006.01)

(52) U.S. Cl.
  CPC ........ *H01L 29/2003* (2013.01); *H01L 21/0254* (2013.01); *H01L 29/1095* (2013.01); *H01L 21/02389* (2013.01); *H01L 29/207* (2013.01); *H01L 29/66204* (2013.01)

(58) Field of Classification Search
  CPC ............. H01L 21/02389; H01L 21/02538; H01L 21/0254; H01L 29/20–29/207; H01L 29/66204; H01L 29/861; H01L 29/872; H01L 29/8725; H01L 29/6609–29/66219
  See application file for complete search history.

(56) References Cited

U.S. PATENT DOCUMENTS

| | | | | |
|---|---|---|---|---|
| 8,212,288 B2* | 7/2012 | Komiyama et al. | ........... | 257/190 |
| 8,569,153 B2* | 10/2013 | Bour et al. | ........... | 438/488 |
| 8,796,738 B2* | 8/2014 | Briere | ........... | 257/194 |
| 8,946,788 B2* | 2/2015 | Kizilyalli et al. | ........... | 257/263 |
| 2010/0244101 A1* | 9/2010 | Kokawa et al. | ........... | 257/201 |
| 2014/0264366 A1* | 9/2014 | Kosaki et al. | ........... | 257/76 |

FOREIGN PATENT DOCUMENTS

JP    2007-299793    11/2007

OTHER PUBLICATIONS

"HVPE GaN for high power electronic Schottky diodes" by R.P. Tompkins et al., Solid-State Electronics vol. 79, Jan. 2013, pp. 238-243.*

(Continued)

*Primary Examiner* — Matthew Landau
*Assistant Examiner* — Eric Ward
(74) *Attorney, Agent, or Firm* — Roberts Mlotkowski Safran & Cole, PC

(57) ABSTRACT

A high voltage gallium nitride based semiconductor device includes an n-type gallium nitride freestanding substrate, and an n-type gallium nitride based semiconductor layer including a drift layer formed on the surface of the n-type gallium nitride freestanding substrate so as to have a reverse breakdown voltage of not less than 3000 V. The drift layer is configured such that a carbon concentration is not less than $3.0 \times 10^{16}/cm^3$ in a region which has an electric field intensity of not more than 1.5 MV/cm when a maximum allowable voltage where there occurs no breakdown phenomenon is applied as a reverse bias voltage.

3 Claims, 2 Drawing Sheets

(56) References Cited

OTHER PUBLICATIONS

"The effect of carbon impurities on lightly doped MOCVD GaN Schottky diodes" by R.P. Tompkins et al. Journal of Materials Research, Volume, Issue 23, 2011, pp. 2895-2900.*

Seager et al. "Role of carbon in GaN", J. Appl. Phys., vol. 92, No. 11, Dec. 1, 2002, pp. 6553-6560.

Matsumoto et al. "High growth rate metal organic vapor phase epitaxy GaN", J. of Crystal Growth, vol. 310, Aug. 15, 2008, pp. 3950-3952.

Ubukata et al. "High-growth-rate AlGaN buffer layers and atmospheric-pressure growth of low-carbon GaN for AlGaN/GaN HEMT on the 6-in.diameter Si substrate metal-organic vapor phase epitaxy system", J. of Crystal Growth, vol. 370, May 1, 2013, pp. 269-272.

\* cited by examiner

HIGH VOLTAGE GALLIUM NITRIDE BASED SEMICONDUCTOR DEVICE AND MANUFACTURING METHOD OF THE SAME

The present application is based on Japanese patent application No. 2014-021246 filed on Feb. 6, 2014, the entire contents of which are incorporated herein by reference.

BACKGROUND OF THE INVENTION

1. Field of the Invention

This invention relates to a high voltage gallium nitride based semiconductor device and a manufacturing method of the semiconductor device.

2. Description of the Related Art

A gallium nitride (GaN) based semiconductor is widely used all over the world as a material for an optical device represented by a light emitting diode (LED) and a laser diode (LD). Furthermore, the gallium nitride based semiconductor has extremely excellent physical properties of a material such as a wide band gap, a high electron mobility, a high saturation electron speed and a high breakdown voltage, thus in recent years, it is attracting attention also as a material of an electron material represented by a transistor, in particular, its application to a high voltage power device or a high frequency power device is expected.

A metal organic vapor epitaxy (MOVPE) method is capable of precisely control a layer thickness and composition at the time of epitaxially growing a semiconductor layer, and capable of epitaxially growing a semiconductor layer on each surface of a plurality of substrates simultaneously, thus conventionally, the MOVPE method is widely adopted at the time of manufacturing of not only the gallium nitride based semiconductor device, but also a gallium arsenide based semiconductor device such as an aluminum gallium arsenide (AlGaAs) semiconductor device, an indium gallium arsenide (InGaAs) semiconductor device, an indium phosphide based semiconductor device such as an indium gallium phosphide (InGaP) semiconductor device, and other III-V group compound semiconductor device.

A gallium nitride based semiconductor device having a vertical structure configured to supply an electric current in the layer thickness direction of a gallium nitride based semiconductor layer is manufactured by epitaxially growing the gallium nitride based semiconductor layer on a surface of an n-type gallium nitride freestanding substrate by using the above-mentioned metal organic vapor epitaxy (MOVPE) method or the like. In the gallium nitride based semiconductor, mobility of electrons is extremely higher than mobility of positive holes, thus when a high voltage power device is manufactured by using the gallium nitride based semiconductor, it is considered to design such that a carrier concentration of the n-type gallium nitride based semiconductor layer is suppressed to be low and a depletion layer is expanded to the n-type gallium nitride based semiconductor layer when a reverse bias voltage is applied.

If an electric field distribution or a layer thickness of the depletion layer in a Schottky junction or a p-n junction is calculated on the basis of a Poisson equation, it is known that an electric field intensity becomes maximum in the junction surface, the depletion layer is increase in the layer thickness when a high voltage is applied as a reverse bias voltage or the carrier concentration of the n-type gallium nitride based semiconductor layer is suppressed to be low.

Consequently, it is basically preferable that the carrier concentration of the n-type gallium nitride based semiconductor layer is suppressed to be low so that the electric field intensity in the junction surface does not exceed a breakdown voltage, and simultaneously the layer thickness thereof is configured to be thicker than that of the depletion layer, but if the above-mentioned configuration is adopted, an on-resistance is increased when a forward bias voltage is applied.

Therefore, it is considered to suppress the carrier concentration of the n-type gallium nitride based semiconductor layer to be low at an area close to the junction surface and to keep the carrier concentration to be high at an area far from the junction surface for the purpose of reduce the electric field intensity in the junction surface, instead of suppressing the carrier concentration of the n-type gallium nitride based semiconductor layer to be uniformly low over the entire layer. This can be easily considered by solving the Poisson equation to which an appropriate boundary condition is given.

As a donor impurity configured to control an n-type conductivity of the gallium nitride based semiconductor layer, usually silicon (Si), germanium (Ge) or the like is used.

In addition, it is known that carbon (C) included in the gallium nitride based semiconductor layer reduces an electron concentration by compensation effect (e.g., refer to Seager et al., Role of carbon in GaN, Journal of Applied Physics, Vol. 92, No. 11, p. 6553-6560, Dec. 1, 2002). The above-mentioned carbon is not added thereto by intentionally supplying a carbon raw material at the time of epitaxially growing the gallium nitride based semiconductor layer, but is mixed thereinto via a gallium raw material or the like having a carbon-hydrogen (C—H) bond.

It is possible to control a carbon concentration of the gallium nitride based semiconductor layer, for example, if a growth pressure is heightened, the carbon concentration of the gallium nitride based semiconductor layer can be reduced (for example, refer to Seager et al., Role of Carbon in GaN, Journal of Applied Physics, Vol. 92, No. 11, p. 6553-6560, Dec. 1, 2002), and a growth speed is lowered, or a ratio of V/III that means a supply mole ratio between ammonia ($NH_3$) or the like which is a raw material for nitrogen (N) of V group element, and trimethylgallium (($CH_3)_3Ga$) or the like which is a raw material for gallium (Ga) of III group element is increased, the carbon concentration of the gallium nitride based semiconductor layer can be reduced (e.g., refer to Matsumoto et al., High Growth Rate Metal Organic Vapor Phase Epitaxy GaN, Journal of Crystal Growth, Vol. 310, p. 3950-3952, Aug. 15, 2008, and Ubukata et al., High-Growth-Rate AlGaN Buffer Layers and Atmospheric Pressure Growth of Low-Carbon GaN for AlGaN/GaN HEMT on The 6-in.-Diameter Si Substrate Metal-Organic Vapor Phase Epitaxy System, Journal of Crystal Growth, Vol. 370, p. 269-272, May 1, 2013). In addition to the above-mentioned cases, the carbon concentration of the gallium nitride based semiconductor layer can be also drastically changed by changing a kind of a gallium based organic metal material used as a raw material for gallium (e.g., by changing trimethylgallium or triethylgallium (($C_2H_5)_3Ga$)).

From a different viewpoint, the relationship between an off-angle of the n-type gallium nitride freestanding substrate and the carbon concentration of the n-type gallium nitride based semiconductor layer has been investigated in detail, it is known that the carbon concentration of the n-type gallium nitride based semiconductor layer can be reduced by using the n-type gallium nitride freestanding substrate having the off-angle of not less than a certain amount (e.g., refer to JP-A-2007-299793). In particular, in case of the high voltage power device, it is important to precisely control a carrier concentration of the n-type gallium nitride based semiconductor layer of which carrier concentration is low, thus it is preferable that the carbon concentration is as low as possible in terms of obtaining a desired electron concentration in a region where a donor impurity concentration is low.

SUMMARY OF THE INVENTION

In case of the high voltage power device, as mentioned above, a high breakdown voltage cannot be achieved, if the electric field intensity in the junction surface is not be reduced and a breakdown phenomenon is not be prevented by suppressing the carrier concentration to be low at an area close to the junction surface.

Furthermore, the carrier concentration of the n-type gallium nitride based semiconductor layer located at an area close to the junction surface where the carrier concentration is low has a large impact on the electric field intensity adjacent to the junction surface, and has a remarkably large impact on the layer thickness of the depletion layer, thus at an area close to the junction surface, it is needed to control the carrier concentration in an extremely low range.

Consequently, it is important to suppress the carbon concentration to be low that is a cause of an occurrence of compensation effect, and simultaneously to precisely control the donor impurity concentration such as silicon, germanium.

However, when the carbon concentration is suppressed to be low, in most cases, a manufacturing cost is increased. For example, when the growth pressure is heightened, it is needed to supply a large flow amount of gas at high speed in order to prevent a gas-phase reaction in a growth furnace, thus the device is enlarged in size and the manufacturing cost is increased. In addition, when the growth speed is lowered, a time required for growth becomes longer, thus it directly results in an increase of the manufacturing cost. Furthermore, when the ratio of V/III is enlarged for the purpose of suppressing the carbon concentration to be low without heightening the growth pressure and lowering the growth speed, it is needed to supply ammonia in an extremely large amount. As ammonia, usually a liquefied gas type ammonia is used, but a vapor pressure of ammonia is low, thus for the purpose of increasing the supply volume, it is needed to considerably enlarge the ammonia supply equipment in size and a processing capability of an abatement equipment may become a problem.

It is an object of the invention to provide a high voltage gallium nitride based semiconductor device that is suitable as a high voltage power device while preventing an increase in a manufacturing cost, as well as a manufacturing method of the high voltage gallium nitride based semiconductor device.

(1) According to one embodiment of the invention, a high voltage gallium nitride based semiconductor device comprises:

an n-type gallium nitride freestanding substrate, and an n-type gallium nitride based semiconductor layer including a drift layer formed on the surface of the n-type gallium nitride freestanding substrate so as to have a reverse breakdown voltage of not less than 3000 V, wherein the drift layer is configured such that a carbon concentration is not less than $3.0\times10^{16}/cm^3$ in a region which has an electric field intensity of not more than 1.5 MV/cm when a maximum allowable voltage where there occurs no breakdown phenomenon is applied as a reverse bias voltage.

In the above embodiment (1) of the invention, the following modifications and changes can be made.

(i) The drift layer has a thickness of not less than 10 μm.

(2) According to another embodiment of the invention, a manufacturing method of a high voltage gallium nitride based semiconductor device including an n-type gallium nitride freestanding substrate, and an n-type gallium nitride based semiconductor layer including a drift layer formed on the surface of the n-type gallium nitride freestanding substrate so as to have a reverse breakdown voltage of not less than 3000 V comprises:

in epitaxially growing a region of the drift layer which has an electric field intensity of not more than 1.5 MV/cm when the maximum allowable voltage where there occurs no breakdown phenomenon is applied as a reverse bias voltage, setting a growth temperature to not less than 1000 degrees C. and not more than 1200 degrees C., a growth pressure to not less than 30 kPa and not more than 70 kPa, and a ratio of V/III to not less than 2000 and not more than 8000, so that a carbon concentration of the region is not less than $3.0\times10^{16}/cm^3$.

EFFECTS OF THE INVENTION

According to one embodiment of the invention, a high voltage gallium nitride based semiconductor device can be provided that is suitable as a high voltage power device while preventing an increase in a manufacturing cost.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

The preferred embodiments according to the invention will be explained below.

The high voltage gallium nitride based semiconductor device according to the embodiment includes an n-type gallium nitride freestanding substrate, and an n-type gallium nitride based semiconductor layer including a drift layer formed on the surface of the n-type gallium nitride freestanding substrate, so as to have a reverse breakdown voltage of not less than 3000 V, wherein the drift layer is configured such that a carbon concentration is not less than $3.0\times10^{16}/cm^3$ in a region which has an electric field intensity of not more than 1.5 MV/cm when a maximum allowable voltage where there occurs no breakdown phenomenon is applied as a reverse bias voltage.

As the n-type gallium nitride freestanding substrate, for the purpose of preventing a leak current from being increased due to a dislocation that is a kind of a crystal defect and preventing a reverse breakdown voltage from being deteriorated, it is preferable that an n-type gallium nitride freestanding substrate having a low dislocation density is used. In addition, it is preferable that the n-type gallium nitride freestanding substrate is configured such that a plane orientation thereof is a C surface, but the plane orientation may be slightly inclined from the C surface.

Here, a reason why the drift layer is configured such that a carbon concentration is not less than $3.0\times10^{16}/cm^3$ in a region in which an electric field intensity becomes not more than 1.5 MV/cm when the maximum allowable voltage by which a breakdown phenomenon is not generated is applied as a reverse bias voltage will be explained.

Conventionally, reduction in the electron concentration caused by the compensation effect of carbon has been prevented by suppressing the carbon concentration to be uniformly low over the whole of the drift layer configured to secure the reverse breakdown voltage, but when realizing a high voltage gallium nitride based semiconductor device configured such that the reverse breakdown voltage is not less than 3000V, it is needed to configure the layer thickness of the drift layer to be not less than 10 μm dependent on the reverse breakdown voltage required, thus the growth condition for suppressing the carbon concentration to be low has to be maintained over a long time, so that the manufacturing cost is remarkably increased.

Consequently, the inventors have intended to reduce the manufacturing cost accompanying with an epitaxial growth of the drift layer by not adopting the growth condition for suppressing the carbon concentration to be low with regard to a region of the drift layer in which the carbon concentration is not needed to be suppressed to be low, instead of suppressing the carbon concentration to be uniformly low over the whole of the drift layer.

Figure 1:
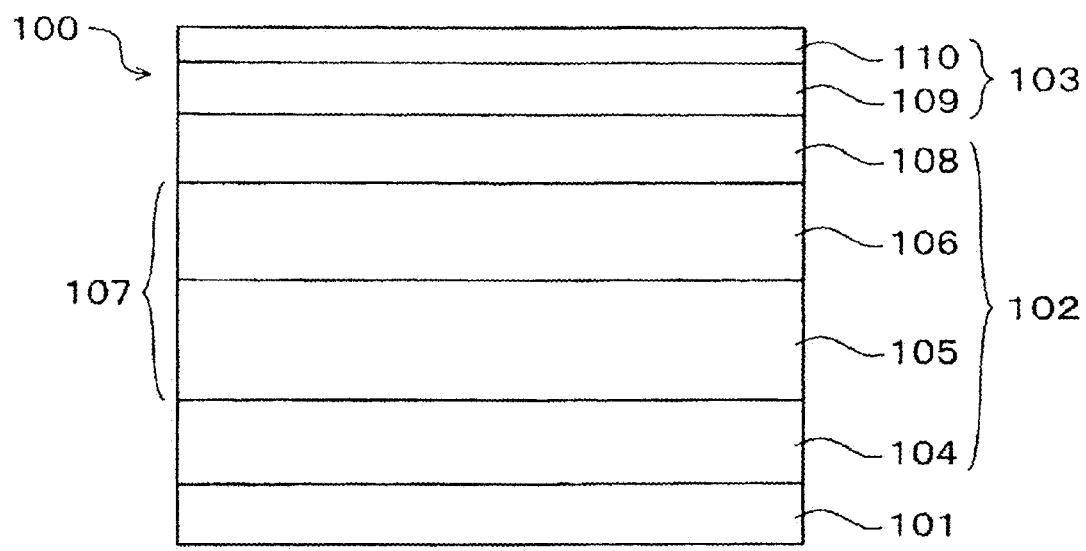
FIG. 1 is a cross-sectional view schematically showing a p-n junction diode manufactured by Example.

In the process, as shown in FIG. 1, a p-n junction diode 100 has been manufactured by epitaxially growing an n-type gallium nitride based semiconductor layer 102 and a p-type gallium nitride based semiconductor layer 103 in order on the surface of an n-type gallium nitride freestanding substrate 101 configured such that a plane orientation thereof is a C surface.

At this time, as the raw materials, trimethylgallium and ammonia are used, and as the doping raw material, a monosilane ($SiH_4$ diluted by nitrogen ($N_2$) regarding silicon (Si), and a biscyclopentadienylmagnesium ($(C_5H_5)_2Mg$) regarding magnesium (Mg) are used. As the above-mentioned raw materials, for the purpose of reducing an unintended influence of a donor impurity and an acceptor impurity as much as possible, high purity products distributed as products for an electronic industry are used. In addition, an organic metal gas-phase growth device is used, the device being capable of controlling the growth pressure in a range of not less than 10 kPa and not more than 101 kPa, and the growth temperature in a range to approximately 1200 degrees C.

First, the first n-type gallium nitride based semiconductor layer 104 in which a silicon concentration is $2.0 \times 10^{18}/cm^3$ has been epitaxially grown on the surface of the n-type gallium nitride freestanding substrate 101 so as to have the layer thickness of not less than 2 μm and not more than 4 μm.

Subsequently, the second n-type gallium nitride based semiconductor layer 105 in which a silicon concentration is $2.0 \times 10^{16}/cm^3$ and the carbon concentration of $3.0 \times 16/cm^3$ has been epitaxially grown on the surface of the first n-type gallium nitride based semiconductor layer 104 so as to have the layer thickness of X μm (wherein $0 \leq X \leq 15$). Here, the impurity concentration has been confirmed by secondary ion mass spectrometry (SIMS).

According to a survey by the inventors, it is estimated that the carrier concentration of the n-type gallium nitride based semiconductor layer is identical with the silicon concentration [approximately 0.3×(carbon concentration)], thus the carbon concentration of the second n-type gallium nitride based semiconductor layer 105 is approximately $1.1 \times 10^{16}/cm^3$.

When the compensation ratio is defined as [$0.3 \times$(carbon concentration)]/(silicon concentration), the compensation ratio of the second n-type gallium nitride based semiconductor layer 105 is such a high value as 0.5, thus it can be said that the second n-type gallium nitride based semiconductor layer 105 is a high compensation ratio drift layer.

After that, the third n-type gallium nitride based semiconductor layer 106 in which the silicon concentration is $1.2 \times 10^{16}/cm^3$ and the carbon concentration of $5.0 \times 10^{15}/cm^3$ that is the measuring lower limit has been epitaxially grown on the surface of the second n-type gallium nitride based semiconductor layer 105 so as to have the layer thickness of (15−X) μm (wherein $0 \leq X \leq 15$).

When estimating the carrier concentration of the third n-type gallium nitride based semiconductor layer 106, it is not more than approximately $1.1 \times 10^{16}/cm^3$ and the compensation ratio is such a low value as not more than 0.1, thus it can be said that the third n-type gallium nitride based semiconductor layer 106 is a low compensation ratio drift layer.

In the embodiment, the high compensation ratio drift layer and the low compensation ratio drift layer are gathered as one group so as to be referred to as the drift layer 107.

Furthermore, the fourth n-type gallium nitride based semiconductor layer 108 in which the silicon concentration is $3.0 \times 10^{15}/cm^3$ and the carbon concentration of $5.0 \times 10^{15}/cm^3$ that is the measuring lower limit has been epitaxially grown on the surface of the third n-type gallium nitride based semiconductor layer 106 so as to have the layer thickness of 5 μm.

The compensation ratio of the fourth n-type gallium nitride based semiconductor layer 108 is not more than 0.5, and when estimating the carrier concentration thereof, it is such a low value as not more than approximately $1.5 \times 10^{15}/cm^3$, thus it can be said that the fourth n-type gallium nitride based semiconductor layer 108 is a low carrier concentration layer adjacent to the junction layer.

Next, the first p-type gallium nitride based semiconductor layer 109 in which the magnesium concentration is $1.0 \times 10^{18}/cm^3$ has been epitaxially grown on the surface of the fourth n-type gallium nitride based semiconductor layer 108 so as to have the layer thickness of 0.5 μm, and furthermore, the second p-type gallium nitride based semiconductor layer 110 in which the magnesium concentration is $2.0 \times 10^{20}/cm^3$ has been epitaxially grown on the surface of the first p-type gallium nitride based semiconductor layer 109 so as to have the layer thickness of 20 nm.

The first n-type gallium nitride based semiconductor layer 104 in which the silicon concentration is high, and the first p-type gallium nitride based semiconductor layer 109 and the second p-type gallium nitride based semiconductor layer 110 in which magnesium is doped have been epitaxially grown by the same growth condition as the conventional growth condition because reduction in the electron density caused by the compensation effect of carbon is within a range that is so small as to be negligible.

On the other hand, with regard to the second n-type gallium nitride based semiconductor layer 105 that is a high compensation ratio drift layer and the third n-type gallium nitride based semiconductor layer 106 that is a low compensation ratio drift layer, the carbon concentration has been controlled by adjusting the growth temperature, the growth pressure and the ratio of V/III (supply mole ratio between ammonia and trimethylgallium).

In particular, the second n-type gallium nitride based semiconductor layer 105 that is a high compensation ratio drift layer has been epitaxially grown under the condition that the growth temperature is not less than 1000 degrees C. and not more than 1200 degrees C., the growth pressure is not less than 30 kPa and not more than 70 kPa and the ratio of V/III is not less than 2000 and not more than 8000, so that the carbon concentration thereof is not less than $3.0 \times 10^{16}/cm^3$, and the third n-type gallium nitride based semiconductor layer 106 that is a low compensation ratio drift layer has been epitaxially grown under the condition that the growth temperature is not less than 1000 degrees C. and not more than 1200 degrees C., the growth pressure is not less than 90 kPa and not more than 101 kPa and the ratio of V/III is not less than 2500 and not more than 20000, so that the carbon concentration thereof is not less than $5.0 \times 10^{15}/cm^3$.

In the p-n junction diode 100 having the above-mentioned structure, the layer thickness of the second n-type gallium nitride based semiconductor layer 105 that is a high compensation ratio drift layer has been changed, as a result, the p-n junction diode 100 in which X=0, namely the high compensation ratio drift layer does not exist has been manufactured.

At this time, a palladium electrode has been used as an anode electrode and a titanium aluminum electrode has been used a cathode electrode. In addition, as the anode electrode, a circular electrode having a diameter of 400 μm has been adopted. Furthermore, for the purpose of separating between elements from each other, the second p-type gallium nitride based semiconductor layer 110 has been removed from the surface thereof to the depth of 1 μm by plasma etching, and a protect layer has been formed in the removed part.

Figure 2:
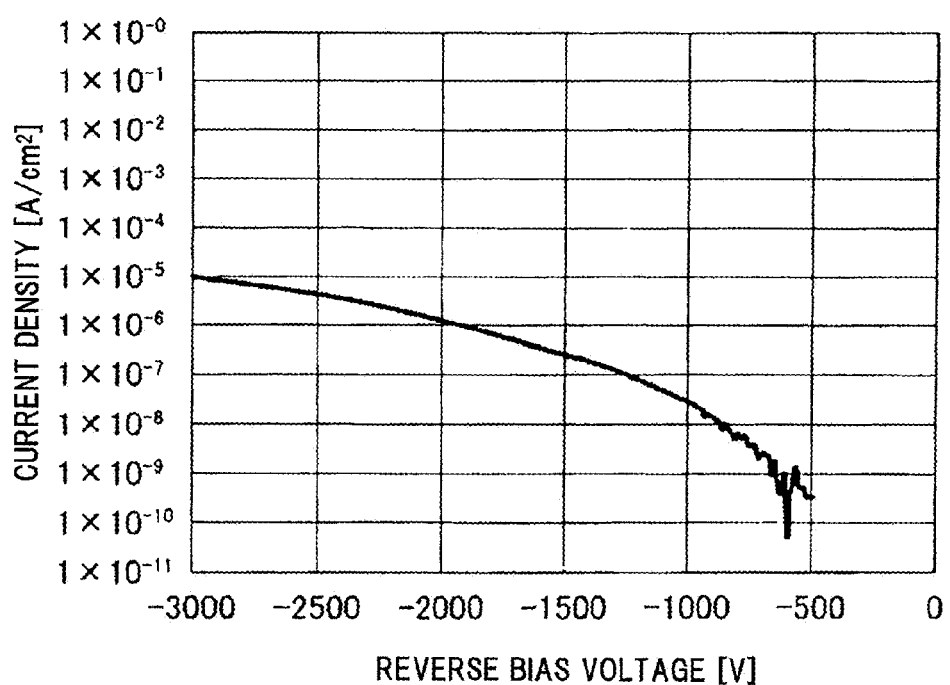
FIG. 2 is a graph showing current-voltage characteristic when a reverse bias voltage is applied to the p-n junction diode in which a drift layer does not exist.
Figure 3:
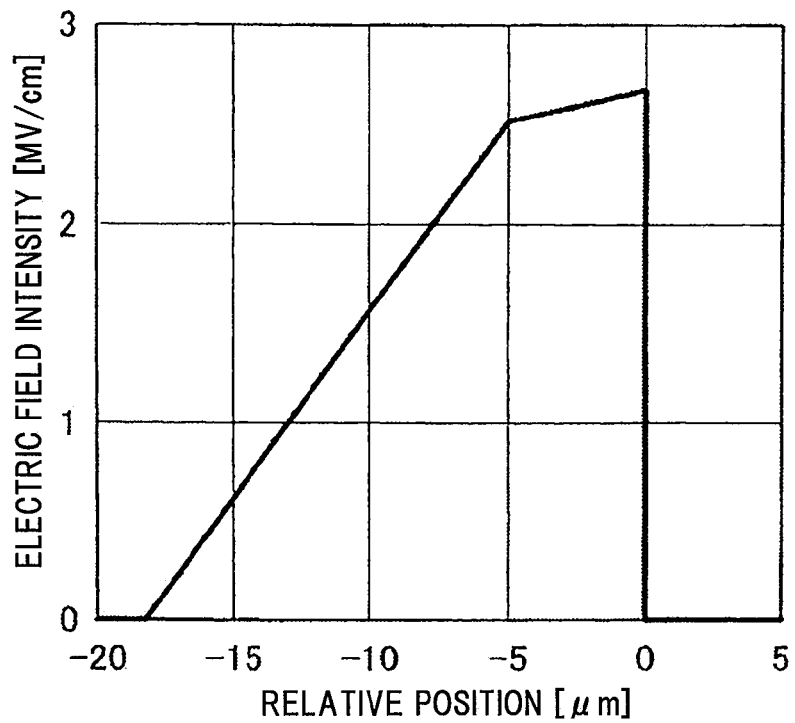
FIG. 3 is a graph showing an electric field distribution when a reverse bias voltage of 3000 V is applied to the p-n junction diode shown in FIG. 1.

And then, as shown in FIG. 2, current-voltage characteristics have been measured when a reverse bias voltage has been applied, and simultaneously as shown in FIG. 3, an electric field distribution has been analytically calculated on the basis of a Poisson equation when the surface side has been located in the positive side on the basis of the junction surface and the reverse bias voltage of 3000 V has been applied.

Figure 4:
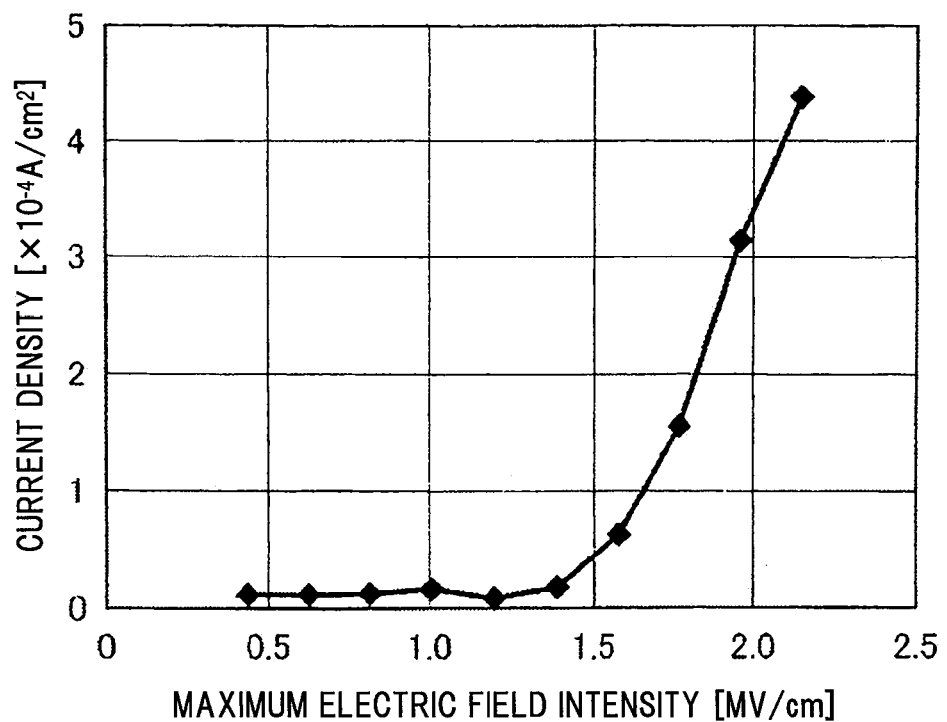
FIG. 4 is a graph showing a relationship between the maximum electric field intensity applied to the drift layer having a high compensation ratio and a current density of a leak current when a reverse bias voltage of 3000 V is applied.

As a result, as shown in FIG. 4, a relationship between the maximum electric field intensity applied to the drift layer 107 and a current density of a leak current when the reverse bias voltage of 3000 V is applied can be known, so that it has been understood that the leak current at the time of the reverse bias voltage being applied is drastically increased when the electric field intensity applied to the drift layer 107 exceeds 1.5 MV/cm.

From the above, the inventors have found out that with regard to a region in which the electric field intensity becomes not more than 1.5 MV/cm when the maximum allowable voltage by which a breakdown phenomenon is not generated is applied as the reverse bias voltage, namely with regard to the second n-type gallium nitride based semiconductor layer 105 that is a high compensation ratio drift layer, even if it is epitaxially grown without adopting the growth condition for suppressing the carbon concentration to be low, the leak current when the reverse bias voltage is applied is hardly increased.

For the purpose of verifying the above-mentioned knowledge, the inventors have similarly investigated with regard to one that includes the second n-type gallium nitride based semiconductor layer 105 in which the a silicon concentration is $2.8 \times 10^{16}/cm^3$ and simultaneously the carbon concentration is $6.0 \times 10^{16}/cm^3$, and the compensation ratio is 0.64, then the leak current has been increased as a whole, but almost the same result as that of the above-mentioned one has been obtained.

Consequently, with regard to the second n-type gallium nitride based semiconductor layer 105 that is a high compensation ratio drift layer, it has been substantiated that the carbon concentration is slightly increased, but a high voltage gallium nitride based semiconductor device having a reverse breakdown voltage of not less than 3000 V can be obtained even if the grown condition in which the manufacturing cost is low is adopted.

As mentioned above, depending on the reverse breakdown voltage required, it is needed that the drift layer 107 has the layer thickness of not less than 10 μm, thus for example, the ratio of V/III is reduced and the second n-type gallium nitride based semiconductor layer 105 that constitutes a part of the drift layer 107 is epitaxially grown, thereby the manufacturing cost can be drastically reduced so that the industrial meaning thereof becomes extremely large.

As already explained, according to the invention, a high voltage gallium nitride based semiconductor device that is suitable as a high voltage power device while preventing an increase in a manufacturing cost and a manufacturing method of the same can be provided.

A high voltage gallium nitride based semiconductor device such as a bipolar transistor has not been commercially put to practical use up to the present, but superiority can be found therein than a device comprised of other material system due to the excellent material characteristics, thus in particular, it is expected to be widely used as a power conversion element in an industrial device or a consumer device.

Further, the invention is a technique regarding a high voltage gallium nitride based semiconductor device having a multilayer structure including an n-type gallium nitride based semiconductor layer in which the carried concentration is low, the high voltage gallium nitride based semiconductor device including a drift layer in which the electric field intensity is not more than a certain value, and the device structure is not particularly limited to the above-mentioned structure, but for example, it is possible to be applied to a pin diode, a Schottky barrier diode, a bipolar transistor or a thyristor structure.

Next, a concrete example of the invention will be explained.

A p-n junction diode configured such that the first p-type gallium nitride based semiconductor layer 109 and the second p-type gallium nitride based semiconductor layer 110 do not exist in the p-n junction diode shown in FIG. 1 has been manufactured, an anode electrode having a field plate structure has been formed on the surface of the fourth n-type gallium nitride based semiconductor layer 108, and a cathode electrode has been formed on the rear surface of the n-type gallium nitride freestanding substrate 101, so that a Schottky barrier diode has been manufactured.

Also about the Schottky barrier diode, with regard to a region in which the electric field intensity becomes not more than 1.5 MV/cm when the maximum allowable voltage by which a breakdown phenomenon is not generated is applied as the reverse bias voltage, namely with regard to the second n-type gallium nitride based semiconductor layer 105 that is a high compensation ratio drift layer, the carbon concentration is slightly increased, but there has been hardly any influence on the reverse breakdown voltage even if the grown condition in which the manufacturing cost is low is adopted.

From the above, it has been substantiated that the effect of the invention can be also obtained in a high voltage gallium nitride based semiconductor device having a structure other than the above-mentioned structure.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A high voltage gallium nitride based semiconductor device, comprising:
   an n-type gallium nitride freestanding substrate, and an n-type gallium nitride based semiconductor layer including a drift layer formed on the surface of the n-type gallium nitride freestanding substrate so as to have a reverse breakdown voltage of not less than 3000 V, wherein the drift layer is configured such that a carbon concentration is not less than $3.0 \times 10^{16}/cm^3$ in a region which has an electric field intensity of not more than 1.5 MV/cm when a maximum allowable voltage where there occurs no breakdown phenomenon is applied as a reverse bias voltage.

2. The high voltage gallium nitride based semiconductor device according to claim 1, wherein the drift layer has a thickness of not less than 10 μm.

3. A manufacturing method of a high voltage gallium nitride based semiconductor device including an n-type gallium nitride freestanding substrate, and an n-type gallium nitride based semiconductor layer including a drift layer formed on the surface of the n-type gallium nitride freestanding substrate so as to have a reverse breakdown voltage of not less than 3000 V, the manufacturing method comprising:

in epitaxially growing a region of the drift layer which has an electric field intensity of not more than 1.5 MV/cm when the maximum allowable voltage where there occurs no breakdown phenomenon is applied as a reverse bias voltage, setting a growth temperature to not less than 1000 degrees C. and not more than 1200 degrees C., a growth pressure to not less than 30 kPa and not more than 70 kPa, and a ratio of V/III to not less than 2000 and not more than 8000, so that a carbon concentration of the region is not less than $3.0 \times 10^{16}/cm^3$.

\* \* \* \* \*